United States Patent
Takeuchi et al.

(10) Patent No.: US 6,348,115 B1
(45) Date of Patent: Feb. 19, 2002

(54) METHOD FOR PRODUCING A CERAMIC DIAPHRAGM STRUCTURE

(75) Inventors: Yukihisa Takeuchi, Aichi-prefecture; Tsutomu Nanataki, Toyoake; Katsuyuki Takeuchi, Aichi-prefecture, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/382,071

(22) Filed: Aug. 24, 1999

(30) Foreign Application Priority Data

Sep. 14, 1998 (JP) .................................. 10-260677

(51) Int. Cl.$^7$ .................... B32B 31/26; H01L 41/09
(52) U.S. Cl. ................. 156/89.11; 156/89.12; 310/324
(58) Field of Search ................ 156/89.11, 89.12; 310/324

(56) References Cited

U.S. PATENT DOCUMENTS 5,545,461 A    8/1996  Takeuchi et al.
5,997,671 A  * 12/1999  Takeuchi et al. ......... 156/89.11
6,045,642 A  *  4/2000  Takeuchi et al. ......... 156/89.11

FOREIGN PATENT DOCUMENTS

| EP | 0 713 255 B1 | 11/1995 |
| EP | 0 813 254 A1 | 6/1997 |
| JP | 8-51238 | 2/1996 |

* cited by examiner

Primary Examiner—Curtis Mayes
(74) Attorney, Agent, or Firm—Burr & Brown (57) ABSTRACT

A method for forming a ceramic diaphragm structure includes providing a laminate of a ceramic green substrate having at least one window and a plurality of layers, and a thin ceramic green sheet superimposed on the ceramic green substrate to cover the at least one window. The laminate is fired so that the ceramic green sheet provides a diaphragm portion protruding in a direction away from the at least one window, and the fired laminate is subjected to a second firing step under load.

12 Claims, 1 Drawing Sheet

METHOD FOR PRODUCING A CERAMIC DIAPHRAGM STRUCTURE

BACKGROUND OF THE INVENTION AND RELATED ART STATEMENT

The present invention relates to a method for producing a ceramic diaphragm structure which is used as a constitutional member of various kinds of sensors, piezoelectric/electrostrictive actuators, or the like.

A ceramic diaphragm structure has a structure in which a thin and flexible diaphragm plate is superposed on a substrate having at least one window portion so as to cover the window portion and to work as a diaphragm. Such a ceramic diaphragm structure is used for various kinds of sensors by being constituted so that a diaphragm portion detects a bending displacement originated from a subject to be measured by an adequate means, or used as a constituting member of a piezoelectric/electrostrictive actuator by being constituted so that a pressure is given to the pressure room formed inside the actuator by deformation of the diaphragm portion due to a piezoelectric/electrostrictive element.

Figure 1:
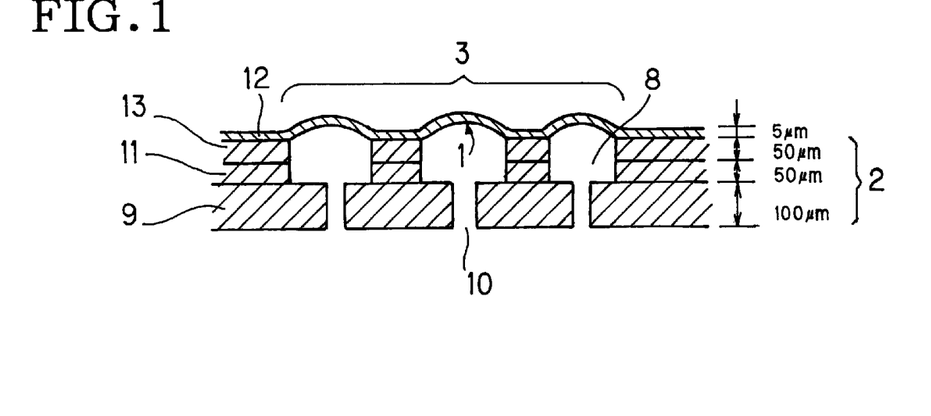
FIG. 1 is a cross sectional view showing an embodiment of a ceramic diaphragm structure having a diaphragm portion having a protrudent shape.

A ceramic diaphragm structure is produced by unitarily superposing a thin ceramic green sheet (hereinafter referred to as a green sheet) on a ceramic green substrate (hereinafter referred to as a green substrate) to obtain a laminate, and subsequently firing the laminate. After firing, the green substrate becomes a substrate, and the green sheet becomes a diaphragm plate. Generally, there is used a ceramic diaphragm structure 3 having a diaphragm portion 1 formed to have a protrudent shape toward the side opposite to a window portion 8 of a substrate 2 as shown in FIG. 1, so as to prevent a crack or a depression in a firing step. Such a diaphragm portion 1 having a protrudent shape as described above can have a higher inherent resonance frequency in comparison with a diaphragm portion having a flat shape. Further, it is recognized that a diaphragm portion having a protrudent shape is excellent in mechanical strength and is not hindered upon sintering a film formed on the surface of the diaphragm portion 1.

In the fields of sensor and piezoelectric/electrostrictive actuator, since a demand for high precision and densification is raised, it is required to make a diaphragm portion more minute or to increase the number of the diaphragm portions.

When a ceramic diaphragm structure having a protrudent shape is produced, there are used materials which satisfy the following formulae 1), 2), and 3):

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

(wherein S(substrate) and S(sheet) denote shrinkage rates (%) of the ceramic green substrate and the ceramic green sheet, respectively, and $T_{70}$(substrate) and $T_{70}$(sheet) denote mid-sintering temperatures (° C.) of the ceramic green substrate and the ceramic green sheet, respectively.).

JP-A-8-51238 discloses that by using such a material, a protrusion can be made in a green sheet (diaphragm plate) toward the side opposite to a window portion arranged in a substrate during firing without any crack or the like. That is, a thin ceramic portion having a protrudent shape can be formed by setting differences in shrinkage rate and mid-sintering temperature between a green substrate and a green sheet.

Incidentally, a shrinkage rate (%) means a shrinkage rate (%), in a direction of a surface, of a green substrate and a green sheet independently fired at the same temperature as the temperature at which a laminate is fired, and the shrinkage rate (%) is shown by {(length before firing–length after firing)/length before firing}×100(%). The term "a direction of surface" does not mean the direction of thickness, but means a predetermined direction on the surface where a green substrate or a green sheet is molded. A mid-sintering temperature means a firing temperature at which a shrinkage reaches 70% of the aforementioned shrinkage rate, S(substrate) and S(sheet) in a firing step, and a mid-sintering temperature is a barometer showing a sintering speed.

Figure 2:
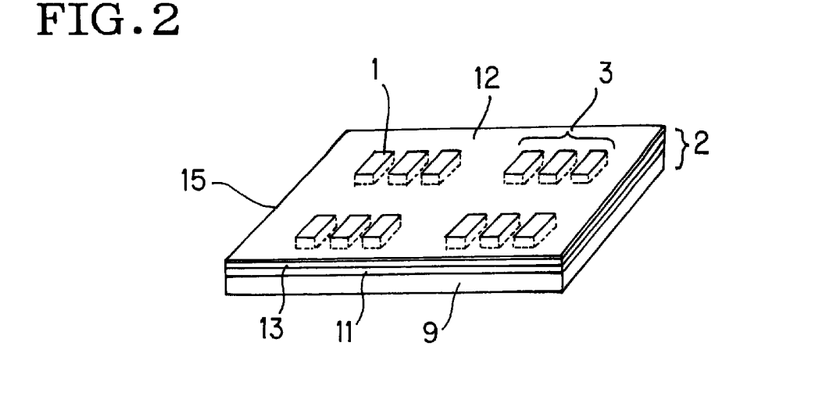
FIG. 2 is a perspective view showing an embodiment of a ceramic plate having a plurality of ceramic diaphragm structure.

However, the method disclosed in JP-A-8-51238 is on the supposition that a shrinkage rate and a mid-sintering temperature of a green substrate are uniform from a portion near a green sheet to a portion apart from the green sheet. However, in this method, as shown in FIG. 2, a ceramic diaphragm structure 3 is constituted of a substrate 2 and a diaphragm plate 12, and a plurality of the ceramic diaphragm structures 3 constitutes a ceramic plate 15. Therefore, a diaphragm structure has a large waviness, and a warpage is caused wholly in a ceramic plate including diaphragm structures.

It is difficult to reform the aforementioned warpage and waviness even if the ceramic substrate is subjected to firing again with loading. When a load on the ceramic plate is too large, a diaphragm portion 1 and/or a substrate 2 damage(s). When a warpage or a waviness is left as it is, dimensional preciseness of a diaphragm structure 3 deteriorates, and therefore, preciseness in printing of a film pattern on a diaphragm plate deteriorates, and/or variance in thickness of a film formed on the diaphragm plate is caused. Accordingly, when such a diaphragm structure is used for a sensor, such a sensor brings deviation in detection preciseness, and when it is used for a piezoelectric/electrostrictive actuator, such an actuator brings deterioration or variance in displacement.

As a result of the various studies, the present inventors proposed, in JP-A-10-117024, the following method as a method for producing a ceramic diaphragm structure, which can form a diaphragm portion having a protrusion toward the side opposite to a window portion of a substrate and which can advantageously reduce a waviness of a diaphragm structure and/or a warpage of a ceramic plate including the diaphragm structures.

First, we proposed a method for producing a ceramic diaphragm structure, comprising the steps of:

superposing a thin ceramic green sheet having at least one layer on a ceramic green substrate having at least one window portion and at least one layer so as to cover the window portion to obtain a unitary laminate, and firing the unitary laminate so that a diaphragm portion has a protrusion toward a side opposite to the window portion;

wherein the ceramic green substrate and the ceramic green sheet satisfy the formulae:

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

(wherein S(substrate), and S(sheet) denote shrinkage rates (%) of the ceramic green substrate and the ceramic green sheet, respectively, and $T_{70}$(substrate) and $T_{70}$(sheet) denote mid-sintering temperatures (° C.) of the ceramic green substrate and the ceramic green sheet, respectively.), and an average sintering temperature difference of the layers of the ceramic green substrate, shown by the following formula, is larger than 0:

$$4) \quad \sum_{n=1}^{N} T_{70}(\text{substrate})_n \int_{tn}^{tn+1} \times dx$$

(wherein N denotes the number of layers constituting the ceramic green substrate, $T_{70}(\text{substrate})_n$ denotes a mid-sintering temperature (° C.) of a layer positioned in the nth place from the bottom of the laminate in the ceramic green substrate having the ceramic green sheet thereon, $t_n$ and $t_{n+1}$ denote distances from the lower and upper surfaces, respectively, of the layer positioned in the nth place to a neutral line of the substrate after firing the unitary laminate, using (−) for a surface under the neutral line and (+) for a surface over the neutral line.).

Secondly, the inventors proposed a method for producing a ceramic diaphragm structure, comprising the steps of:

superposing a thin ceramic green sheet having at least one layer on a ceramic green substrate having at least one window portion and at least one layer so as to cover the window portion to obtain a unitary laminate, and firing the unitary laminate so that a diaphragm portion has a protrusion toward a side opposite to the window portion;

wherein the ceramic green substrate and the ceramic green sheet satisfy the aforementioned formulae 1), 2) and 3) (hereinafter the same thing is applicable to them), i.e.,:

$S(\text{substrate})-S(\text{sheet}) \geq -0.08\{T_{70}(\text{substrate})-T_{70}(\text{sheet})\}-1$     1)

$0 \leq T_{70}(\text{substrate})-T_{70}(\text{sheet}) \leq 300$,     2)

and $S(\text{substrate})-S(\text{sheet}) \leq 20$     3)

(wherein S(substrate), and S(sheet) denote shrinkage rates (%) of the ceramic green substrate and the ceramic green sheet, respectively, $T_{70}(\text{substrate})$ and $T_{70}(\text{sheet})$ denote mid-sintering temperatures (° C.) of the ceramic green substrate and the ceramic green sheet, respectively.), and an average shrinkage-rate difference of the layers of the ceramic green substrate, shown by the following formula 5), is larger than 0;

$$5) \quad \sum_{n=1}^{N} S(\text{substrate})_n \int_{tn}^{tn+1} \times dx$$

(wherein N denotes the number of layers constituting the ceramic green substrate, $S(\text{substrate})_n$ denotes a shrinkage rate (%) of a layer positioned in the nth place from the bottom of the laminate in the ceramic green substrate having the ceramic green sheet thereon, and $t_n$ and $t_{n+1}$ donote distances from the lower and upper surfaces, respectively, of the layer positioned in the nth place to a neutral line of the substrate after firing the unitary laminate, using (−) for a surface under the neutral line and (+) for a surface over the neutral line.).

In other words, in the method for producing a ceramic diaphragm structure disclosed by JP-A-10-117024, firing is conducted under a condition that an average mid-sintering temperature difference shown by the formula 4) is larger then 0 or that an average shrinkage-rate difference shown by the formula 5) is larger than 0.

Specifically, as embodiments for the aforementioned methods, there are 5 kinds of embodiments in which desired ceramic diaphragm structures are produced by firing under a condition that both an average mid-sintering temperature difference shown by the formula 4) and an average shrinkage-rate difference shown by the formula 5) are larger than 0, that an average mid-sintering temperature difference is larger than 0 and an average shrinkage-rate difference is equal to 0 or smaller than 0, or that an average shrinkage-rate difference is larger than 0 and an average mid-sintering temperature difference is equal to 0 or smaller than 0.

However, even if firing is conducted under the aforementioned conditions, there is sometimes observed a phenomenon of partial distortion or deformation in a protrudent shape of a diaphragm portion, or unevenness in protrudent shape between adjacent diaphragm portions which are formed in series. Unevenness in protrudent shape is sometimes observed among a plurality of diaphragm structures which are disposed on a ceramic plate.

In the course of various investigation, it has been found that such a phenomenon is generated with high frequency as a diaphragm portion become finer and as the number of diaphragm portions to be formed is increased.

Therefore, the present invention aims to provide a method for producing a ceramic diaphragm structure in which protrudent shape of the diaphragm portion is not deformed, distorted, or uneven in the firing process.

SUMMARY OF THE INVENTION

As a result of various investigation, we have found that the aforementioned problems can be solved by the firing under a condition that an average mid-sintering temperature difference shown by the formula 4) is smaller than 0 and/or an average shrinkage-rate difference shown by the formula 5) is smaller than 0 with an approach which is different from the method disclosed by the aforementioned JP-A-10-117024 as a method for suppressing deformation, distortion, or unevenness in a protrudent shape of a diaphragm portion with resignation to generation of warpage and waviness in a ceramic plate including the diaphragm structures to a certain degree. Particularly, we have found that, when a warpage (including waviness) upon firing a ceramic plate is not larger than 10 mm, such a warpage (waviness) can be sufficiently corrected by firing again the ceramic plate, under a suitable load, at a temperature of 1200° C.–1700° C., preferable about the same temperature as the temperature at which the ceramic plate was fired and that deformation, distortion, or unevenness in a protrudent shape of a diaphragm portion can be suppressed by conduct firing under the aforementioned conditions. Thus, the present invention has been accomplished based on the above-mentioned findings.

A method for producing a ceramic diaphragm structure according to the present invention are classified into the following 4 embodiments. That is, 1) An average mid-sintering temperature difference shown by the formula 4) is smaller than 0, and an average shrinkage-rate difference shown by the formula 5) is smaller than 0.

2) An average mid-sintering temperature difference shown by the formula 4) is 0, and an average shrinkage-rate difference shown by the formula 5) is smaller than 0.

3) An average mid-sintering temperature difference shown by the formula 4) is smaller than 0, and an average shrinkage-rate difference shown by the formula 5) is 0.

4) One of an average mid-sintering temperature difference shown by the formula 4) and an average shrinkage-rate difference shown by the formula 5) is larger than 0, and the other is smaller than 0, and the value given by the following formula 6):

6) $\sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx$ (wherein N, S(substrate)$_n$, T$_{70}$(substrate)$_n$, t$_n$, and t$_{n+1}$ denote as mentioned above.) is smaller than 0.

The aforementioned embodiments 1)–4) include an embodiment which satisfies the following formula 7):

7) $\sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx >$
$-15\{(t_{N+1} - t_1)/2\}^2$ (wherein N, S(substrate)$_n$, T$_{70}$(substrate)$_n$, t$_n$, and t$_{n+1}$ denote as mentioned above, t$_1$ denotes, using (−), a distance from a lower surface of a lowest layer of the substrate to a neutral line of the substrate after the unitary laminate is fired, and t$_{N+1}$ denotes, using (+), a distance from an upper surface of the layer positioned in number N place from the lowest layer of the substrate to the neutral line of the substrate after the unitary laminate is fired.).

That is, as a first embodiment of the present invention, there is provided a method for forming a ceramic diaphragm structure comprising the steps of:
a) providing a laminate, comprising:
   i) a ceramic green substrate having at least one window therethrough and a plurality of layers; and
   ii) a thin ceramic green sheet having at least one layer superposed on the ceramic green substrate to cover the at least one window; and
b) firing the laminate so that the ceramic green sheet provides a diaphragm portion protruding in a direction away from the at least one window;
wherein the ceramic green substrate and the ceramic green sheet satisfy the aforementioned formulae 1), 2) and 3), i.e.,:

S(substrate)−S(sheet)≧−0.08{T$_{70}$(substrate)−T$_{70}$(sheet)}−1    1)

0≦T$_{70}$(substrate)−T$_{70}$(sheet)≦300,    2)

and

S(substrate)−S(sheet)≦20    3)

(wherein S(substrate) and S(sheet) denote shrinkage rates (%) of the ceramic green substrate and the ceramic green sheet, respectively, and T$_{70}$(substrate) and T$_{70}$(sheet) denote mid-sintering temperatures (° C.) of the ceramic green substrate and the ceramic green sheet, respectively.), and an average mid-sintering temperature difference of the ceramic green substrate, shown by the following formula, is smaller than 0:

4) $\sum_{n=1}^{N} T_{70}(\text{substrate})_n \int_{tn}^{tn+1} \times dx$ (wherein N denotes the number of layers constituting the ceramic green substrate, T$_{70}$(substrate)$_n$ denotes a mid-sintering temperature (° C.) of a layer positioned in the nth place from the bottom of the laminate in the ceramic green substrate having the ceramic green sheet thereon, t$_n$ and t$_{n+1}$ denote distances from the lower and upper surfaces, respectively, of the layer positioned in the nth place to a neutral line of the substrate after firing the unitary laminate, using (−) for a surface under the neutral line and (+) for a surface over the neutral line.), and an average shrinkage-rate difference of the ceramic green substrate, shown by the following formula, is smaller than 0:

5) $\sum_{n=1}^{N} S(\text{substrate})_n \int_{tn}^{tn+1} \times dx$ (wherein N, t$_n$, and t$_{n+1}$ denote as described above, and S(substrate)$_n$ denotes a shrinkage rate (%) of a layer positioned in the nth place from the bottom of the laminate in the ceramic green substrate having the ceramic green sheet thereon.).

As a second embodiment of the present invention, there is provided a method for forming a ceramic diaphragm structure comprising the steps of:
a) providing a laminate, comprising:
   i) a ceramic green substrate having at least one window therethrough and a plurality of layers; and
   ii) a thin ceramic green sheet having at least one layer superposed on the ceramic green substrate to cover the at least one window; and
b) firing the laminate so that the ceramic green sheet provides a diaphragm portion protruding in a direction away from the at least one window;
wherein the ceramic green substrate and the ceramic green sheet satisfy the formulae 1), 2), and 3):

S(substrate)−S(sheet)≧−0.08{T$_{70}$(substrate)−T$_{70}$(sheet)}−1    1)

0≦T$_{70}$(substrate)−T$_{70}$(sheet)≦300,    2)

and

S(substrate)−S(sheet)≦20    3)

(wherein S(substrate), and S(sheet), T$_{70}$(substrate), and T$_{70}$ (sheet) denote as described above.) and an average mid-sintering temperature difference of the ceramic green substrate, shown by the following formula, is 0:

4) $\sum_{n=1}^{N} T_{70}(\text{substrate})_n \int_{tn}^{tn+1} \times dx$ (wherein N, T$_{70}$(substrate)$_n$, t$_n$, and t$_{n+1}$ denote as described above.), and an average shrinkage-rate difference of the ceramic green substrate, shown by the formula, is smaller than 0:

5) $\sum_{n=1}^{N} S(\text{substrate})_n \int_{tn}^{tn+1} \times dx$ (wherein N, S(substrate)$_n$, t$_n$, and t$_{n+1}$ denote as described above.).

As a third embodiment of the present invention, there is provided a method for forming a ceramic diaphragm structure comprising the steps of:

a) providing a laminate, comprising:
  i) a ceramic green substrate having at least one window therethrough and a plurality of layers; and
  ii) a thin ceramic green sheet having at least one layer superposed on the ceramic green substrate to cover the at least one window; and
b) firing the laminate so that the ceramic green sheet provides a diaphragm portion protruding in a direction away from the at least one window;
wherein the ceramic green substrate and the ceramic green sheet satisfy the formulae:

$S(\text{substrate}) - S(\text{sheet}) \geq -0.08\{T_{70}(\text{substrate}) - T_{70}(\text{sheet})\} - 1$  1)

$0 \leq T_{70}(\text{substrate}) - T_{70}(\text{sheet}) \leq 300$,  2)

and $S(\text{substrate}) - S(\text{sheet}) \leq 20$  3)

(wherein $S(\text{substrate})$, $S(\text{sheet})$, $T_{70}(\text{substrate})$, and $T_{70}(\text{sheet})$ denote as described above.), and average mid-sintering temperature difference of the ceramic green substrate, shown by the following formula 4), is smaller than 0:

4) $\sum_{n=1}^{N} T_{70}(\text{substrate})_n \int_{tn}^{tn+1} \times dx$ (wherein N, $T_{70}(\text{substrate})_n$, $t_n$, and $t_{n+1}$ denote as described above.), and an average shrinkage-rate difference of the ceramic green substrate, shown by the formula 5), is 0:

5) $\sum_{n=1}^{N} S(\text{substrate})_n \int_{tn}^{tn+1} \times dx$ (wherein N, $S(\text{substrate})_n$, $t_n$, and $t_{n+1}$ denote as described above.).

As a fourth embodiment of the present invention, there is provided a method for forming a ceramic diaphragm structure comprising the steps of:
a) providing a laminate, comprising:
  i) a ceramic green substrate having at least one window therethrough and a plurality of layers; and
  ii) a thin ceramic green sheet having at least one layer superposed on the ceramic green substrate to cover the at least one window; and
b) firing the laminate so that the ceramic green sheet provides a diaphragm portion protruding in a direction away from the at least one window;
wherein the ceramic green substrate and the ceramic green sheet satisfy the formulae:

$S(\text{substrate}) - S(\text{sheet}) \geq -0.08\{T_{70}(\text{substrate}) - T_{70}(\text{sheet})\} - 1$  1)

$0 \leq T_{70}(\text{substrate}) - T_{70}(\text{sheet}) \leq 300$,  2)

and $S(\text{substrate}) - S(\text{sheet}) \leq 20$  3)

(wherein $S(\text{substrate})$, $S(\text{sheet})$, $T_{70}(\text{substrate})$, and $T_{70}(\text{sheet})$ denote as described above.), and one of an average mid-sintering temperature difference of the ceramic green substrate, shown by the following formula 4):

4) $\sum_{n=1}^{N} T_{70}(\text{substrate})_n \int_{tn}^{tn+1} \times dx$ (wherein N, $T_{70}(\text{substrate})_n$, $t_n$, and $t_{n+1}$ denote as described above.), and an average shrinkage-rate difference of the ceramic green substrate, shown by the formula 5):

5) $\sum_{n=1}^{N} S(\text{substrate})_n \int_{tn}^{tn+1} \times dx$ (wherein N, $S(\text{substrate})_n$, $t_n$, and $t_{n+1}$ denote as described above.), is smaller than 0, and the other is larger than 0, and a value of the ceramic green substrate, given by the following formula 6), is smaller than 0:

6) $\sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx$ (wherein N, $S(\text{substrate})_n$, $T_{70}(\text{substrate})_n$, $t_n$, and $t_{n+1}$ denote as described above.).

As described above, each of the aforementioned four embodiments of the present invention includes an embodiment satisfying the following formula 7):

7) $\sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx >$ $-15\{(t_{N+1} - t_1)/2\}^2$ (wherein N, $S(\text{substrate})_n$, $T_{70}(\text{substrate})_n$, $t_n$ and $t_{n+1}$ denote as described above, $t_1$ denotes, using (−), a distance from a lower surface of a lowest layer of the substrate to a neutral line of the substrate after the unitary laminate is fired, and $t_{N+1}$ denotes, using (+), a distance from an upper surface of the layer positioned in number N place from the lowest layer of the substrate to the neutral line of the substrate after the unitary laminate is fired.).

DETAILED DESCRIPTION OF THE INVENTION

In the present invention, a ceramic diaphragm structure is produced by the use of a green substrate having a plurality of layers and a green sheet having at least one layer each having a shrinkage rate and a mid-sintering temperature satisfying the following formulae 1), 2), and 3):

$S(\text{substrate}) - S(\text{sheet}) \geq -0.08\{T_{70}(\text{substrate}) - T_{70}(\text{sheet})\} - 1$  1)

$0 \leq T_{70}(\text{substrate}) - T_{70}(\text{sheet}) \leq 300$,  2)

and $S(\text{substrate}) - S(\text{sheet}) \leq 20$  3)

(wherein symbols in the formulae denote as described above.). Further, there is used a substrate in which an average mid-sintering temperature difference, shown by the formula 4), is smaller than 0:

$$4)\quad \sum_{n=1}^{N} T_{70}(\text{substrate})_n \int_{tn}^{tn+1} \times dx,$$

and/or an average shrinkage-rate difference, shown by the formula 5), is smaller than 0:

$$5)\quad \sum_{n=1}^{N} S(\text{substrate})_n \int_{tn}^{tn+1} \times dx.$$

Further, in the case that one of the formulae 4) and 5) is smaller than 0 and the other is larger than 0, a value given by the formula 6) needs to be smaller than 0. Even if one of the formulae 4) and 5) is larger than 0, a desired effect can be exhibited as long as a value given by the following formula 6) is smaller than 0:

$$6)\quad \sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx.$$

The reason is not completely obvious.

Since the formulae 4) and 5) are on different levels, they cannot be directly compared with each other with using the same criterion. However, it can be surmised that desired effects can be exhibited if those conditions may be satisfied by adjusting the weights of the respective factors as shown by the equation 6). When the formula 6) does not satisfy the aforementioned conditions, it is a matter of course that desired effects can not be obtained.

Figure 3:
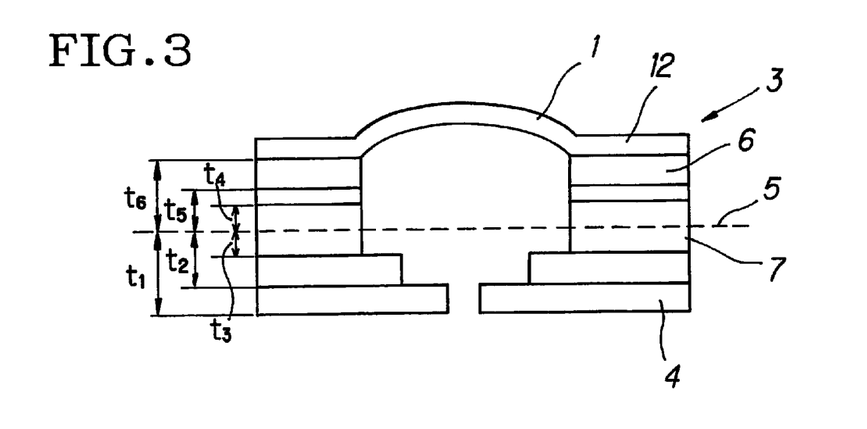
FIG. 3 is a cross sectional view of a ceramic plate schematically showing a relation between composition of a layer and a neutral line of a ceramic diaphragm structure.

In the formula 4), N denotes a number of layers constituting a green substrate. $T_{70}$(substrate), denotes mid-sintering temperature (° C.) of a layer positioned in the nth place from the bottom of the laminate in the ceramic green substrate having the ceramic green sheet thereon as shown in FIG. 3, and $t_n$ and $t_{n+1}$ denote distances from the lower and upper surfaces, respectively, of the layer positioned in the nth place to a neutral line 5 of the substrate, using (−) for a surface under the neutral line and (+) for a surface over the neutral line. The neutral line 5 is a line formed by connecting middle points to one another between the lower surface of the lowest layer 4 and the upper surface of the layer 6 positioned in number N place after firing the unitary laminate. In the formula 5), S(substrate)$_n$ denotes a shrinkage rate (%) of a layer positioned in the nth place from the lowest layer of the green substrate having a green sheet thereon.

Incidentally, S(substrate) in the formulae 1), 3) can be calculated by the following formula 8):

$$8)\quad S(\text{substrate}) = \sum_{n=1}^{N} C_n \cdot S(\text{substrate})_n / C$$

(wherein N and S(substrate)$_n$ mean as described above, $C_n$ denotes a thickness of the layer positioned in the nth from the bottom of the unitary laminate after firing the unitary laminate, C denotes a thickness of a substrate after firing the unitary laminate, and by the following formula 9):

$$9)\quad C = \sum_{n=1}^{N} C_n$$

(wherein N and $C_n$ mean as described above.). $T_{70}$(substrate) in the formulae 1) and 2) can be calculated by the following formula 10):

$$10)\quad T_{70}(\text{substrate}) = \sum_{n=1}^{N} C_n \cdot T_{70}(\text{substrate})_n / C$$

(wherein N, $T_{70}$(substrate)$_n$, Cn and C mean as described above.). When a green sheet is constituted of a plurality of layers, S(sheet) in the formulae 1) and 3) is calculated by the following formula 11):

$$11)\quad S(\text{sheet}) = \sum_{n=1}^{L} [B_n \times S(\text{sheet})_n]/B$$

(wherein L denotes a number of layers constituting a green sheet, S(sheet)$_n$ denotes a shrinkage rate (%) of a layer positioned in the nth place from the lowest layer among the layers constituting the ceramic green sheet when the green sheet is positioned on the upper side, $B_n$ denotes a thickness of the layer positioned in the nth place from the bottom layer among the layers constituting a diaphragm plate after firing the unitary laminate, and B denotes a thickness of all diaphragm plates.), and is shown by the formula 12):

$$12)\quad B = \sum_{n=1}^{L} B_n$$

(wherein L, $B_n$, and B mean as described above.). $T_{70}$(sheet) in the formulae 1) and 2) is calculated by the following formula 13):

$$13)\quad T_{70}(sheet) = \sum_{n=1}^{L} [B_n \times T_{70}(\text{sheet})_n /B$$

(wherein L, $B_n$, and B mean as described above, and $T_{70}$(sheet)$_n$ denotes a shrinkage rate (%) of a layer positioned in the nth place from the lowest layer among the layers constituting the ceramic green sheet when the green sheet is positioned on the upper side.).

Therefore, according to the method of the present invention, influence of a mid-sintering temperature and a shrinkage rate of a green substrate to a green sheet with a change due to a distance from the green sheet is adjusted. That is, by constituting a green substrate by a plurality of layers each having an independent mid-sintering temperature and an independent shrinkage rate and adjusting the values, there can be produced a ceramic plate in which a diaphragm portion or diaphragm portions have a uniform protrudent shape toward the side opposite to the window portion formed in a substrate with keeping a warpage and/or a waviness within a range in which a problem is not caused in practical use and without deformation, distortion, or unevenness in the protrudent shape of the diaphragm portion (s).

There is no restriction on the way of providing a multiple-layered laminate of the ceramic green substrate and the thin ceramic green sheet when a laminate is prepared from a plurality of layers for the ceramic green substrate and a plurality of layers for the thin ceramic green sheet, as far as the ceramic green substrate is superposed in a right order on the thin ceramic green sheet before firing. That is, there is no restriction on the number of press fitting processes of the laminate (the number of divisions), or the order of press fitting of the laminate.

Specifically, in a substrate having a layer-constitution shown in the following Table 1, difference in average mid-sintering temperature and in average shrinkage rate are calculated as follows by formulae 4) and 5) as follows:

TABLE 1

|  | Layer | Thickness |
|---|---|---|
| Substrate | Sixth layer ($T_6$, $S_6$) | 100 μm |
|  | Fifth layer ($T_5$, $S_5$) | 200 μm |
|  | Fourth layer ($T_4$, $S_4$) | 100 μm |
|  | Third layer ($T_3$, $S_3$) | 100 μm |
|  | Second layer ($T_2$, $S_2$) | 100 μm |
|  | First layer ($T_1$, $S_1$) | 100 μm |

Note: The neutral line of this substrate layer runs across the central portion of the fourth layer is located at the same distance from the bottom surface of the lowest layer and the top surface of the highest layer.

$$4) = T_1 \times [(1/2)x^2]_{-350}^{-250} + T_2 \times [(1/2)x^2]_{-250}^{-150} + T_3 \times [(1/2)x^2]_{-150}^{-50} +$$
$$T_4 \times [(1/2)x^2]_{-50}^{50} + T_5 \times [(1/2)x^2]_{50}^{250} + T_6 \times [(1/2)x^2]_{250}^{350}$$
$$= (-60000\, T_1 - 40000\, T_2 - 20000\, T_3 + 0\, T_4 + 60000\, T_5 + 60000\, T_6)/2$$

$$5) = S_1 \times [(1/2)x^2]_{-350}^{-250} + S_2 \times [(1/2)x^2]_{-250}^{-150} + S_3 \times [(1/2)x^2]_{-150}^{-50} +$$
$$S_4 \times [(1/2)x^2]_{-50}^{50} + S_5 \times [(1/2)x^2]_{50}^{250} + S_6 \times [(1/2)x^2]_{250}^{350}$$
$$= (-60000\, S_1 - 40000\, S_2 - 20000\, S_3 + 0\, S_4 + 60000\, S_5 + 60000\, S_6)/2$$

$T_1$–$T_6$ and $S_1$–$S_6$ in the above 4) and 5) show mid-sintering temperatures and shrinkage rates of the first–sixth layers independently measured in advance. For example, in the first embodiment of the method of the present invention, the only thing to be required is that both values given by 4) and 5) are smaller than 0. The only thing to be required is that mid-sintering temperatures and shrinkage rates are selected so as to satisfy the conditions that one of the values given by 4) and 5) is smaller than 0 and the other is 0 in the second and the third embodiments and that one of the values given by 4) and 5) is larger than 0 and the other is smaller than 0, and a value given by 6) is smaller than 0 in the fourth embodiment. Additionally, it is preferable that a mid-sintering temperature and a shrinkage rate are selected so as to further satisfy the formula 7) in the aforementioned four embodiments.

Incidentally, a shrinkage rate can be controlled by adjusting length of mixing time in a ball mill and amount of dispersant, and a mid-sintering temperature can be controlled by adjusting length of mixing time in a ball mill, an amount of sintering aid, for example, an amount of alumina when a main material is zirconia, a size of particle diameter of powder, a composition of materials, etc. Methods of these are known to persons of ordinary skill.

When layers constituting a green substrate are connected to one another, a connecting layer is sometimes formed between the layers by applying or printing a paste or slurry containing mainly ceramic powder, binder, plasticizer, solvent, and the like. In such a case, the connecting layer is treated as a substrate in the aforementioned calculation. An adhesive layer used at a boundary of the green sheet and a green substrate is also treated as a substrate layer in calculation. A mid-sintering temperature of a green substrate in a portion below a neutral line of the substrate after firing the unitary laminate is preferably higher than that of a green sheet in view of enhancing a forming stability of a protrudent shape. Of course, a warpage (including waviness) can be corrected by firing the ceramic plate at an adequate temperature with loading if the warpage (including waviness) is 10 mm or less.

In the present invention, a shrinkage rate of a green substrate in a portion below a neutral line of the substrate after being fired the unitary laminate is preferably higher than that of a green sheet in view of enhancing a forming stability of a protrudent shape.

The mid-sintering temperature of a green substrate below the neutral line after being fired is expressed by the following formula 14):

$$14) \quad \sum_{n=1}^{M} [A_n \times T_{70}(\text{substrate})_n]/A$$

(wherein M denotes the number of layers positioned below a neutral line among the layers constituting a substrate after firing a unitary laminate, $A_n$ denotes a thickness of the layer positioned in the nth place from the lowest layer among the layers constituting a substrate after firing the unitary laminate, provided that $A_n$ denotes a thickness from the lower surface of the layer to the neutral line as to the layer positioned in number M from the lowest layer, $T_{70}$ (substrate)$_n$ means as described above, and A denotes a distance from the lower surface of the lowest layer of a substrate to the neutral line after firing the unitary laminate, that is, A is shown by A=½ C. and formula 15):

$$15) \quad A = \sum_{n=1}^{M} A_n$$

(wherein M, A, and $A_n$ mean as described above.).

A shrinkage rate (%) of a green substrate below a neutral line after being fired is shown by the formula 16):

$$16) \quad \sum_{n=1}^{M} [A_n \times S(\text{substrate})_n]/A$$

(wherein M, A, and An mean as described above. A, and An mean as described above.). A shrinkage rate (%) and a mid-sintering temperature (° C.) of a green sheet are shown by the formulae 11) and 13), respectively.

When layers constituting a green sheet are connected to one another, a connecting layer is sometimes formed in each of the gaps between the layers by applying or printing a paste or slurry containing mainly ceramic powder, binder, plasticizer, solvent, and the like. In such a case, the connecting layer is treated as a sheet layer in the aforementioned calculation.

In the present invention, a ceramic diaphragm structure is produced by the use of a green substrate and a green sheet satisfying the above conditions.

That is, a ceramic diaphragm structure can be produced according to the method disclosed by JP-A-8-51238 except for setting an average mid-sintering temperature difference or an average shrinkage-rate difference as described above. An outline of the method is as follows:

In the beginning, layers for a green substrate and layers for a green sheet are molded. As a material of a green substrate and a green sheet, there may be used mullite, beryllia, spinel, titania, aluminum nitride, silicon nitride, stabilized zirconia, a partially stabilized zirconia, alumina, magnesia or a mixture thereof. Any of those materials mentioned above may contain a sintering aid in an amount of 30% by weight or less. Alternatively, there may be used a raw material which becomes one of the aforementioned material after being fired.

Particularly, a material for a green sheet is preferably a partially stabilized zirconia, stabilized zirconia, alumina, a mixture thereof as a main component, or a raw material which becomes one of these materials after being fired. More preferably, as is disclosed in JP-A-5-270912, there is used a material having as a main component a partially stabilized zirconia consisting mainly of tetragonal crystals or a mixed crystals consisting of at least two kinds selected from tetragonal crystals, cubic crystals, monoclinic crystals by adding a compound such as yttrium oxide.

A material for a green substrate is preferably the same or similar as that of the green sheet in view of reliability and unitary forming of the green substrate and the green sheet. Of course, it is not limited to such a material, and material having a different composition can be used. A ceramic material such as glass-ceramic or cordierite may be used.

Incidentally, the green sheet is desirably formed by the use of partially stabilized zirconia, completely stabilized zirconia, alumina, a material containing a mixture thereof as a main component, or a raw material which becomes one of these materials after firing, the material having a form of powder 5 having an average particle diameter of 0.05–1.0 $\mu$m in view of mechanical strength of a diaphragm portion.

A diaphragm plate of a ceramic diaphragm structure is preferably 30 $\mu$m or less, more preferably 3–20 $\mu$m. The diaphragm plate has a relative density (bulk density/theoretical density) of preferably 90% or more, more preferably 95% or more, furthermore preferably 98% or more in view of strength, Young's modulus, or the like.

A thickness of a substrate is not particularly limited, and it is suitably determined depending on its use of a diaphragm structure. However, a total thickness of a substrate is preferably 50 $\mu$m or more, more preferably 150 $\mu$m or more, in order to increase an effect of the present invention.

A substrate having a window portion, i.e., a layer which contacts with a green sheet may preferably have two layers having the same shape and the same or different thickness in view of productivity.

Layers of a green substrate and layer(s) of a green sheet can be obtained by preparing a slurry or a paste obtained by adding a binder, a plasticizer, a dispersant, a sintering aid, an organic solvent, etc., to the aforementioned material; molding constituent members by a conventionally known method such as a doctor blading, a calendering method, a printing method, and a reverse roll coater method; subjecting the constituent members to cutting, trimming, punching, or the like as necessary; and piling up the constituent members so as to give a predetermined shape and a predetermined thickness.

Then, a green sheet is superposed on a green substrate so as to prepare a unitary laminate. The green sheet is superposed on the green substrate so as to cover a window portion formed in the green substrate. The unitary laminate can be obtained by heat-pressing or the like.

Each layer of the green substrate and the green sheet may be subjected to piling and press-fitting independently or at one time.

Finally, the unitary laminate is subjected to firing so as to obtain a ceramic diaphragm structure which diaphragm portion has a protrudent shape toward the side opposite to the window portion formed in a substrate. Incidentally, a firing temperature is preferably 1200–1700° C., more preferably 1300–1600° C.

EXAMPLE

The present invention is described in more detail on the basis of Examples. However, the present invention is by no means limited to the Examples.

Example 1

By the use of a material satisfying the aforementioned formulae 1), 2), and 3), there is produced a ceramic diaphragm structure having a three-layered substrate having a mid-sintering temperature and a shrinkage rate shown in Table 2 and Table 3. That is, to 100 parts by weight of a partially stabilized zirconia powder (containing 0.1–0.5% of alumina as sintering aid and being partially stabilized by 3 mol % of yttria) having an average particle diameter of 0.4–1.0 $\mu$m were added 7.6 parts by weight of poly(vinyl butyral) as a binder, 3.8 parts by weight of dioctyl phthalate as a plasticizer, 80 parts by weight of mixture of toluene and 2-propanol in the ratio of 1:1 (by volume) as a solvent, and 0–2.0 parts by weight of sorbitan fatty acid ester as a dispersant as necessary. They were mixed together by a ball mill for 5–50 hours so as to obtain a slurry. The slurry was desired and a viscosity was adjusted so that the slurry for the green sheet has a viscosity of 2000 cps and that the slurry for the green substrate has a viscosity of 20000 cps. The aforementioned slurry is used for molding the green sheet on a polyethylene terephthalate (hereinafter referred to as PET) film by a reverse roll coater and dried. The green substrate is molded on a PET film by doctor blading and dried, and then the green substrate is exfoliated from the PET film.

Incidentally, a shrinkage rate becomes smaller when a time for mixing a material by a ball mill is longer, or when an amount of a dispersant is larger. A mid-sintering temperature becomes lower when a time for mixing in a ball mill is longer or when an amount of alumina is larger. By controlling these factors, a shrinkage rate and a mid-sintering temperature of each layer of a green sheet are adjusted as shown in Table 2.

A mid-sintering temperature and shrinkage rate of the first layer (when a ceramic diaphragm structure is disposed so that a diaphragm plate is placed in the upper side, a layer positioned in number n from the bottom is referred to as nth layer. Hereinbelow, the same manner.) of a green substrate, a mid-sintering temperature and a shrinkage rate of the second layer and the third layer were adjusted as shown in Table 2. A mid-sintering temperature and shrinkage rate of a green sheet were adjusted to be 1272° C. and 21.50%, respectively By piling up the aforementioned layers, a green sheet (with a PET film) was superposed on a green substrate consisting of three layers as shown in FIG. 1. They were heated and pressed at 100° C. under a pressure of 200 kg/cm$^2$ so as to obtain a unitary laminate. The unitary laminate is fired at 1500° C. for 3 hours so as to produce a ceramic plate 15 including four diaphragm structure 3 each having three window portions 8 formed in the second and the third layers of the substrate as shown in FIG. 2. Each window portion 8, i.e., each diaphragm portion 1 had a rectangular shape having a length of a side parallel to a longitudinal direction of the ceramic plate 15 of 0.2 mm and a length of a side parpendicular to a longitudinal direction of the ceramic plate 15 of 0.7 mm. A distance between two adjacent windows along the side having a length of 0.2 mm was 0.1 mm. Additionally, the first layer 9 of the substrate 2 was provided with a throughhole 10 having a diameter of 0.1 mm connecting with a window portion 8 as shown in FIG. 1. In the substrate 2, the second layer 11 and the third layer 13 each had a thickness of 50 $\mu$m, the first layer 9 had a thickness of 100 $\mu$m, and a diaphragm plate 12 had a thickness of 5 $\mu$m.

Thus obtained ceramic plate having a diaphragm structure observed regarding a presence of a waviness and/or warpage to a serious degree, and the warpage (including waviness) is corrected by firing again as necessary. Then, the diaphragm portion is observed for checking a presence or an absence of deformation, distortion, and unevenness in a protrudent shape, and evaluation was given with "good" for the one without any observable problem, "fair" for the one with an acceptable problem, and "bad" for the one with an unacceptable problem. The results are shown in Table 3. Further, a degree of a warpage (including waviness) was checked, and the results are shown in Table 3. A small degree of a warpage/waviness means a warpage (including waviness) of 5 mm or less, and a large degree means a warpage (including waviness) over 5 mm and under 10 mm. In any of the cases, the warpage (including waviness) could be amended by firing again with mounting a flat porous alumina plate thereon at a temperature almost the same as the firing temperature. Thus, a ceramic substrate without problem for practical use could be obtained.

An average mid-sintering temperature difference and an average shrinkage-rate difference of the green substrate, which were calculated on the basis of formulae 4) and 5), are shown in Table 3 with S(substrate), and $T_{70}$(substrate) is shown in Table 2. When these were calculated, there were used a mid-sintering temperature $(T_{70}(substrate)_n)$ and a shrinkage rate $(S(substrate)_n)$ of each layer which was measured by the independent use of samples of 10×10 mm taken from a sheet constituting each layer of the green substrate. The results are shown in Table 2.

TABLE 2

| Experiment No. | Substrate No. | Thickness of substrate (μm) | $T_{70}$(substrate)$_n$ (° C.) | $T_{70}$(substrate) (° C.) | S(substrate)$_n$ (%) |
|---|---|---|---|---|---|
| 1 (Comparative Example) | 3 | 50 | 1272 | 1272 | 20.00 |
| | 2 | 50 | 1272 | | 20.00 |
| | 1 | 100 | 1272 | | 20.00 |
| 2 (Comparative Example) | 3 | 50 | 1330 | 1320 | 20.76 |
| | 2 | 50 | 1330 | | 20.76 |
| | 1 | 100 | 1310 | | 20.76 |
| 3 (Example) | 3 | 50 | 1310 | 1320 | 20.76 |
| | 2 | 50 | 1310 | | 20.76 |
| | 1 | 100 | 1330 | | 20.76 |
| 4 (Example) | 3 | 50 | 1272 | 1291 | 20.00 |
| | 2 | 50 | 1272 | | 20.00 |
| | 1 | 100 | 1310 | | 20.72 |
| 5 (Example) | 3 | 50 | 1322 | 1322 | 20.70 |
| | 2 | 50 | 1322 | | 20.70 |
| | 1 | 100 | 1322 | | 20.97 |
| 6 (Comparative Example) | 3 | 50 | 1322 | 1322 | 20.97 |
| | 2 | 50 | 1322 | | 20.70 |
| | 1 | 100 | 1322 | | 20.70 |
| 7 (Example) | 3 | 50 | 1310 | 1320 | 21.16 |
| | 2 | 50 | 1310 | | 21.16 |
| | 1 | 100 | 1330 | | 20.00 |
| 8 (Comparative Example) | 3 | 50 | 1316 | 1323 | 20.86 |
| | 2 | 50 | 1316 | | 20.86 |
| | 1 | 100 | 1330 | | 20.00 |
| 9 (Comparative Example) | 3 | 50 | 1330 | 1320 | 20.00 |
| | 2 | 50 | 1330 | | 20.00 |
| | 1 | 100 | 1310 | | 21.16 |
| 10 (Example) | 3 | 50 | 1330 | 1323 | 20.00 |
| | 2 | 50 | 1330 | | 20.00 |
| | 1 | 100 | 1316 | | 20.86 |

TABLE 3

| Experiment No. | S (substrate) (%) | Average mid-sintering temperature difference | Average shrinkage-rate difference | Value given by formula 6) | Stability of protrudent shape | Degree of warpage/waviness |
|---|---|---|---|---|---|---|
| 1 (Comp. Ex.) | 20.00 | 0 | 0 | | Bad | — |
| 2 (Comp. Ex.) | 20.76 | >0 | 0 | | Fair | — |
| 3 (Example) | 20.76 | <0 | 0 | | Good | Large |
| 4 (Example) | 20.36 | <0 | <0 | | Good | Large |
| 5 (Example) | 20.84 | 0 | <0 | | Good | Small |
| 6 (Comp. Ex.) | 20.84 | 0 | >0 | | Fair | — |
| 7 (Example) | 20.58 | <0 | >0 | | Good | Small |
| 8 (Comp. Ex.) | 20.43 | <0 | >0 | | Fair | — |
| 9 (Comp. Ex.) | 20.58 | >0 | <0 | >0 | Fair | — |
| 10 (Example) | 20.43 | >0 | <0 | <0 | Good | Small |

Though all diaphragm portions had a protrudent shape in diaphragm structures in Examples of the present invention, a waviness after firing the diaphragm structures and/or a warpage generated after firing a ceramic substrate including the diaphragm structures were(was) observed. However, the waviness and/or the warpage were(was) corrected by firing again with mounting a flat porous alumina plate so that the protrudent shapes of the diaphragm portions were not affected, and all of them were evaluated as"good". On the other hand, a protrudent shape of a diaphragm portion was unstable,or a protrudent shape could not be given to a diaphragm portion in diaphragm structures in Comparative Examples. Therefore, stability of the protrudent shape was evaluated as "fair" or "bad" for any of the diaphragm structures in Comparative Examples.

Example 2

A ceramic diaphragm structure consisting of three-layered green substrate having a mid-sintering temperature and a shrinkage rate shown in Table 4 was produced with a material satisfying the aforementioned formulae 1), 2), and 3) under conditions prescribed in the present invention in the same manner as in Example 1. There was used a green sheet for a diaphragm plate prepared in the same member as in Example 1. The obtained ceramic diaphragm structure was evaluated with the same criteria as in Example 1. Since a warpage including a waviness was found, it was corrected by firing (1400° C.) again with mounting a flat porous alumina plate thereon. The results are shown in Table 4.

TABLE 4

| Experiment No. | Substrate No. | Thickness of substrate (μm) | T70 (substrate)n (° C.) | T70 (substrate) (° C.) | S (substrate)n (%) | S (substrate) (%) | Ave. mid-sintering temperature difference of green substrate | Ave. shrinkage-rate difference of green substrate | Value given by formula 4) | Stability of protrudent shape | Degree of warpage/waviness |
|---|---|---|---|---|---|---|---|---|---|---|---|
| 11 (Example) | 3 | 50 | 1302 | 1306 | 20.00 | 20.18 | <0 | <0 | <0 | Good | Small |
|  | 2 | 50 | 1302 |  | 20.00 |  |  |  |  |  |  |
|  | 1 | 100 | 1310 |  | 20.36 |  |  |  |  |  |  |
| 12 (Example) | 3 | 50 | 1322 | 1322 | 20.00 | 20.49 | 0 | <0 |  | Good | Large |
|  | 2 | 50 | 1322 |  | 20.00 |  |  |  |  |  |  |
|  | 1 | 100 | 1322 |  | 20.97 |  |  |  |  |  |  |
| 13 (Example) | 3 | 50 | 1316 | 1323 | 20.76 | 20.76 | <0 | 0 |  | Good | Small |
|  | 2 | 50 | 1316 |  | 20.76 |  |  |  |  |  |  |
|  | 1 | 100 | 1330 |  | 20.76 |  |  |  |  |  |  |
| 14 (Example) | 3 | 50 | 1310 | 1320 | 20.28 | 20.14 | <0 | >0 | <0 | Good | Large |
|  | 2 | 50 | 1310 |  | 20.28 |  |  |  |  |  |  |
|  | 1 | 100 | 1330 |  | 20.00 |  |  |  |  |  |  |
| 15 (Example) | 3 | 50 | 1320 | 1318 | 20.00 | 20.58 | >0 | <0 | <0 | Good | Large |
|  | 2 | 50 | 1320 |  | 20.00 |  |  |  |  |  |  |
|  | 1 | 100 | 1316 |  | 20.16 |  |  |  |  |  |  |

Though each of the diaphragm structures was required to be fired again, a warpage including a waviness was corrected in any of the cases, and a diaphragm portion had a stable protrudent shape after being fired again.

Since a mid-sintering temperature and a shrinkage rate of layers of a green substrate and layer(s) of a green sheet are controlled so as to satisfy predetermined formulae in a production method of the present invention, adjustment including a change of influence which a mid-sintering temperature and a shrinkage rate of the green substrate give to the green sheet due to a distance from a green sheet becomes possible. As a result, a ceramic diaphragm structure can be produced with controlling a waviness of a diaphragm structure after being fired and/or a warpage of a ceramic plate including the diaphragm structure after being fired to be within a range in which a problem is not caused in practical use and without deformation, distortion, or unevenness in the protrudent shape of the diaphragm portion. Therefore, in the case that the diaphragm structure is used for a sensor, variance in detection preciseness can be avoided. In the case that the diaphragm structure is used for a piezoelectric/electro-strictive actuator, deterioration and variance in displacement and resonant frequency can be avoided. The diaphragm structure of the present invention is effective also as a constituting member of piezoelectric transducers, filters, resonators, oscillators, a display, a gyro, an acceleration sensor, a shock sensor, a micro pump, etc.

What is claimed is:

1. A method for forming a ceramic diaphragm structure comprising the steps of:

a) providing a laminate, comprising:
    i) a ceramic green substrate having at least one window therethrough and a plurality of layers; and
    ii) a thin ceramic green sheet having at least one layer superposed on the ceramic green substrate to cover the at least one window;
  b) firing the laminate so that the ceramic green sheet provides a diaphragm portion protruding in a direction away from the at least one window; and
  c) subjecting the fired laminate to a second firing step under load;

wherein the ceramic green substrate and the ceramic green sheet satisfy the formulae 1), 2) and 3):

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

wherein S(substrate) and S(sheet) denote shrinkage rates (%) of the ceramic green substrate and the ceramic green sheet, respectively, and $T_{70}$(substrate) and $T_{70}$(sheet) denote mid-sintering temperatures (° C.) of the ceramic green substrate and the ceramic green sheet, respectively, and an average mid-sintering temperature difference of the ceramic green substrate, shown by the following formula 4), is smaller than 0:

$$4) \quad \sum_{n=1}^{N} T_{70}(\text{substrate})_n \int_{t_n}^{t_{n+1}} \times dx$$

wherein N denotes the number of layers constituting the ceramic green substrate, $T_{70}$(substrate)$_n$ denotes a mid-sintering temperature (° C.) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line, and an average shrinkage-rate difference of the ceramic green .substrate, shown by the following formula 5), is smaller than 0:

$$5) \quad \sum_{n=1}^{N} S(\text{substrate})_n \int_{t_n}^{t_{n+1}} \times dx$$

wherein N denotes the number of layers constituting the ceramic green substrate, S(substrate)$_n$ denotes a shrinkage rate (%) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in the nth place to a neutral line of the substrate after firing the unitary laminate, using (−) for a surface under the neutral line and (+) for a surface over the neutral line.

2. A method for forming a ceramic diaphragm structure according to claim 1, wherein the following formula 7) is satisfied:

$$7) \quad \sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx > -15\{(t_{N+1} - t_1)/2\}^2$$

wherein N denotes the number of layers constituting the ceramic green substrate, $S(\text{substrate})_n$ denotes a shrinkage rate (%) of a layer positioned in the nth place from the bottom of the laminate in the ceramic green substrate having the ceramic green sheet thereon, $T_{70}(\text{substrate})_n$ denotes a mid-sintering temperature (° C.) of a layer positioned in the nth place from the bottom of the laminate in the ceramic green substrate having the ceramic green sheet thereon, $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line, $t_1$ denotes, using (−), a distance from a lower surface of a lowest layer of the substrate to a neutral line of the substrate after the unitary laminate is fired, and $t_{N+1}$ denotes, using (+), a distance from an upper surface of the layer positioned in number N place from the lowest layer of the substrate to the neutral line of the substrate after the unitary laminate is fired.

3. A method for forming a ceramic diaphragm structure according to claim 1, wherein the second firing step is performed at 1200–1700° C.

4. A method for forming a ceramic diaphragm structure comprising the steps of:
   a) providing a laminate, comprising:
      i) a ceramic green substrate having at least one window therethrough and a plurality of layers; and
      ii) a thin ceramic green sheet having at least one layer superposed on the ceramic green substrate to cover the at least one window;
   b) firing the laminate so that the ceramic green sheet provides a diaphragm portion protruding in a direction away from the at least one window; and
   c) subjecting the fired laminate to a second firing step under load;
   wherein the ceramic green substrate and the ceramic green sheet satisfy the formulae 1), 2), and 3):

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

wherein $S(\text{substrate})$ and $S(\text{sheet})$ denote shrinkage rates (%) of the ceramic green substrate and the ceramic green sheet, respectively, and $T_{70}(\text{substrate})$ and $T_{70}(\text{sheet})$ denote mid-sintering temperatures (° C.) of the ceramic green substrate and the ceramic green sheet, respectively, and an average mid-sintering temperature difference of the ceramic green substrate, shown by the following formula 4), is 0:

$$4) \quad \sum_{n=1}^{N} T_{70}(\text{substrate})_n \int_{tn}^{tn+1} \times dx$$

wherein N denotes the number of layers constituting the ceramic green substrate, $T_{70}(\text{substrate})_n$ denotes a mid-sintering temperature (° C.) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line, and an average shrinkage-rate difference of the ceramic green substrate, shown by the following formula 5), is smaller than 0:

$$5) \quad \sum_{n=1}^{N} S(\text{substrate})_n \int_{tn}^{tn+1} \times dx$$

wherein N denotes the number of layers constituting the ceramic green substrate, $S(\text{substrate})_n$ denotes a shrinkage rate (%) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in the nth place to a neutral line of the substrate after firing the unitary laminate, using (−) for a surface under the neutral line and (+) for a surface over the neutral line.

5. A method for producing a ceramic diaphragm structure according to claim 4, wherein the following formula 7) is satisfied:

$$7) \quad \sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx > -15\{(t_{N+1} - t_1)/2\}^2$$

wherein N denotes the number of layers constituting the ceramic green substrate, $S(\text{substrate})_n$ denotes a shrinkage rate (%) of a layer positioned in the nth place from the bottom of the laminate in the ceramic green substrate having the ceramic green sheet thereon, $T_{70}(\text{substrate})_n$ denotes a mid-sintering temperature (° C.) of a layer positioned in the nth place from the bottom of the laminate in the ceramic green substrate having the ceramic green sheet thereon, $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line, $t_1$ denotes, using (−), a distance from a lower surface of a lowest layer of the substrate to a neutral line of the substrate after the unitary laminate is fired, and $t_{N+1}$ denotes, using (+), a distance from an upper surface of the layer positioned in number N place from the lowest layer of the substrate to the neutral line of the substrate after the unitary laminate is fired.

6. A method for forming a ceramic diaphragm structure according to claim 4, wherein the second firing step is performed at 1200–1700° C.

7. A method for forming a ceramic diaphragm structure comprising the steps of:
   a) providing a laminate, comprising:
      i) a ceramic green substrate having at least one window therethrough and a plurality of layers; and ii) a thin ceramic green sheet having at least one layer superposed on the ceramic green substrate to cover the at least one window;

b) firing the laminate so that the ceramic green sheet provides a diaphragm portion protruding in a direction away from the at least one window; and c) subjecting the fired laminate to a second firing step under load;

wherein the ceramic green substrate and the ceramic green sheet satisfy the formulae 1), 2) and 3):

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

wherein $S(\text{substrate})$ and $S(\text{sheet})$ denote shrinkage rates (%) of the ceramic green substrate and the ceramic green sheet, respectively, and $T_{70}(\text{substrate})$ and $T_{70}(\text{sheet})$ denote mid-sintering temperatures (° C.) of the ceramic green substrate and the ceramic green sheet, respectively, and an average mid-sintering temperature difference of the ceramic green substrate, shown by the following formula 4), is smaller than 0:

$$4) \quad \sum_{n=1}^{N} T_{70}(\text{substrate})_n \int_{t_n}^{t_{n+1}} \times dx$$

wherein N denotes the number of layers constituting the ceramic green substrate, $T_{70}(\text{substrate})_n$ denotes a mid-sintering temperature (° C.) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line, and an average shrinkage-rate difference of the ceramic green substrate, shown by the following formula 5), is 0:

$$5) \quad \sum_{n=1}^{N} S(\text{substrate})_n \int_{t_n}^{t_{n+1}} \times dx$$

wherein N denotes the number of layers constituting the ceramic green substrate, $S(\text{substrate})_n$ denotes a shrinkage rate (%) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in the nth place to a neutral line of the substrate after firing the unitary laminate, using (−) for a surface under the neutral line and (+) for a surface over the neutral line.

8. A method for forming a ceramic diaphragm structure according to claim 7, wherein the following formula 7) is satisfied:

$$7) \quad \sum_{n=1}^{N} T_{70}(\text{substrate})_n \int_{t_n}^{t_{n+1}} \times dx + 16.8 \times \sum_{n=1}^{N} S(\text{substrate})_n \int_{t_n}^{t_{n+1}} \times dx >$$

$$-15\{(t_{N+1} - t_1)/2\}^2$$

wherein N denotes the number of layers constituting the ceramic green substrate, $S(\text{substrate})_n$ denotes a shrinkage rate (%) of a layer positioned in the nth place from the bottom of the laminate in the ceramic green substrate having the ceramic green sheet thereon, $T_{70}(\text{substrate})_n$ denotes a mid-sintering temperature (° C.) of a layer positioned in the nth place from the bottom of the laminate in the ceramic green substrate having the ceramic green sheet thereon, $t_1$ denotes, using (−), a distance from a lower surface of a lowest layer of the substrate to a neutral line of the substrate after the unitary laminate is fired, $t_{N+1}$ denotes, using (+), a distance from an upper surface of the layer positioned in number N place from the lowest layer of the substrate to the neutral line of the substrate after the unitary laminate is fired, and $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line.

9. A method for forming a ceramic diaphragm structure according to claim 7, wherein the second firing step is performed at 1200–1700° C.

10. A method for forming a ceramic diaphragm structure comprising the steps of:

a) providing a laminate, comprising:

i) a ceramic green substrate having at least one window therethrough and a plurality of layers; and ii) a thin ceramic green sheet having at least one layer superposed on the ceramic green substrate to cover the at least one window;

b) firing the laminate so that the ceramic green sheet provides a diaphragm portion protruding in a direction away from the at least one window; and c) subjecting the fired laminate to a second firing step under load;

wherein the ceramic green substrate and the ceramic green sheet satisfy the formulae 1), 2) and 3):

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

wherein $S(\text{substrate})$ and $S(\text{sheet})$ denote shrinkage rates (%) of the ceramic green substrate and the ceramic green sheet, respectively, and $T_{70}(\text{substrate})$ and $T_{70}(\text{sheet})$ denote mid-sintering temperatures (° C.) of the ceramic green substrate and the ceramic green sheet, respectively, and one of an average mid-sintering temperature difference of the ceramic green substrate, shown by the following formula 4):

$$4) \quad \sum_{n=1}^{N} T_{70}(\text{substrate})_n \int_{t_n}^{t_{n+1}} \times dx$$

wherein N denotes the number of layers constituting the ceramic green substrate, $T_{70}(\text{substrate})_n$ denotes a mid-sintering temperature (° C.) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line, and an average shrinkage-rate difference of the ceramic green substrate, shown by the following formula 5):

$$5) \quad \sum_{n=1}^{N} S(\text{substrate})_n \int_{tn}^{tn+1} \times dx$$

wherein N denotes the number of layers constituting the ceramic green substrate, S(substrate)$_n$ denotes a shrinkage rate (%) of a layer positioned in the nth place from the bottom of the laminate in the ceramic green substrate having the ceramic green sheet thereon, and $t_n$ and $t_{n+1}$ denote distances from the lower and upper surfaces, respectively, of the layer positioned in the nth place to a neutral line of the substrate after firing the unitary laminate, using (−) for a surface under the neutral line and (+) for a surface over the neutral line, is smaller than 0, and the other is larger than 0, and a value of the ceramic green sheet substrate, given by the following formula 6), is smaller than 0:

$$6) \quad \sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx$$

wherein N denotes the number of layers constituting the ceramic green substrate, S(substrate)$_n$ denotes a shrinkage rate (%) of a layer positioned in the nth place from the bottom of the laminate in the ceramic green substrate having the ceramic green sheet thereon, $T_{70}$(substrate)$_n$ denotes a mid-sintering temperature (° C.) of a layer positioned in the nth place from the bottom of the laminate in the ceramic green substrate having the ceramic green sheet thereon, $t_n$ and $t_{n+1}$ denote distances from the lower and upper surfaces, respectively, of the layer positioned in number n place to a neutral line of the substrate after firing the unitary laminate, using (−) for a surface under the neutral line and (+) for a surface over the neutral line.

11. A method for forming a ceramic diaphragm structure according to claim 10, wherein the following formula 7)is satisfied:

$$7) \quad \sum_{n=1}^{N} T_{70}(\text{substrate})_n \int_{tn}^{tn+1} \times dx + 16.8 \times \sum_{n=1}^{N} S(\text{substrate})_n \int_{tn}^{tn+1} \times dx > -15\{(t_{N+1} - t_1)/2\}^2$$

wherein N denotes the number of layers constituting the ceramic green substrate, S(substrate$_n$ denotes a shrinkage rate (%) of a layer positioned in the nth place from the bottom of the laminate in the ceramic green substrate having the ceramic green sheet thereon, $T_{70}$(substrate)$_n$ denotes a mid-sintering temperature (° C.) of a layer positioned in the nth place from the bottom of the laminate in the ceramic green substrate having the ceramic green sheet thereon, $t_1$ denotes, using (−), a distance from a lower surface of a lowest layer of the substrate to a neutral line of the substrate after the unitary laminate is fired, $t_{N+1}$ denotes, using (+), a distance from an upper surface of the layer of the substrate to the neutral line of the substrate after the unitary laminate is fired, and $t_n$ and $t_{n+1}$ denote distances from the lower and upper surfaces, respectively, of the layer positioned in number n place to a neutral line of the substrate after firing the unitary laminate, busing (−) for a surface under the neutral line and (+) for a surface over the neutral line.

12. A method for forming a ceramic diaphragm structure according to claim 10, wherein the second firing step is performed at 1200–1700° C.

* * * * *